(12) United States Patent
Morgan et al.

(10) Patent No.: US 6,290,863 B1
(45) Date of Patent: Sep. 18, 2001

(54) METHOD AND APPARATUS FOR ETCH OF A SPECIFIC SUBAREA OF A SEMICONDUCTOR WORK OBJECT

(75) Inventors: Paul A. Morgan, Boise; Kevin Torek, Meridian, both of ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/364,980

(22) Filed: Jul. 31, 1999

(51) Int. Cl.$^7$ ........................................... B44C 1/22
(52) U.S. Cl. .................. 216/73; 216/99; 134/21; 15/302; 438/756
(58) Field of Search ................ 216/73, 99, 109; 134/21; 438/756, 745, 753; 15/302

(56) References Cited

U.S. PATENT DOCUMENTS

| | | | |
|---|---|---|---|
| 4,634,509 | 1/1987 | Shimizu et al. | 204/182.4 |
| 4,692,398 | 9/1987 | Durham | 430/329 |

(List continued on next page.)

OTHER PUBLICATIONS

Peter Van Zant, Microchip Fabrication: A Practical Guide To Semiconductor Processing (3$^{rd}$ Ed. McGraw Hill 1997), pp. 174–189, 226–244, & 259–283.

B. Witowski et al, Characterization of an Anhydrous HF Pre–Gate Oxidation Etching Process, published in Proceedings of the Second International Symposium on Cleaning Technology in Semiconductor Device Manufacturing, vol. 92–12, pp 372–408, (Undated.).

Peter Singer, Wafer Cleaning: Making the Transition to Surface Engineering, published by Seimconductor International, the Industry's Source book for Processing Assembly & Testing in Oct. 1995, pp. 88–92.

Industry News, published by Semiconductor International, The Industry's Source Book for Processing Assembly & Testing in Sep. 1995 pp. 18 & 21.

Nobuhiro et al., Gas–Phase Selective Etching of Native Oxide, published by IEEE Transactions on Electron Devices in Jan., 1990, vol. 37, No. 1, pp107–115.

Werner Kern and David A. Puotinen, Cleaning Solutions Based on Hydrogen Peroxide for use in Silicon Semiconductor Technology, published by RCA Review in Jun. 1970, vol. 31, No. 2, pp. 187–206.

Mark Jenson and Dan Syverson, BPSG to Thermal Oxide Etch Selectivity for Contact Clean Applications, Technical Report 362, published by FSI International in Jan. 29, 1991, pp 1–9.

Primary Examiner—Randy Gulakowksi
Assistant Examiner—Shamim Ahmed
(74) Attorney, Agent, or Firm—Bradley M. Ganz, Esq.

(57) ABSTRACT

The present invention provides a dynamic-flow system that uses a vacuum to pull an etchant or other processing agent through a nozzle onto the surface of the work object. The processing agent can only communicate with the vacuum and be pulled onto the wafer surface when the nozzle is sealed against the work object. Therefore, the processing agent is dispensed onto the surface of the wafer or other work object under a negative rather than a positive pressure. Accordingly, the dispensation of the processing agent is self-stopping in the event that seal of the nozzle against the work object fails. The present invention also provides a novel nozzle for dispensing a processing agent onto a selected area of a work object. The nozzle of the present invention provides a substantially unidirectional flow of processing agent along the surface of a work object and maximizes the contact time of the processing agent at the surface of the work object. This unidirectional flow leads to uniform process results, including better control of etching depth.

70 Claims, 4 Drawing Sheets

U.S. PATENT DOCUMENTS

| | | | |
|---|---|---|---|
| 4,717,681 | 1/1988 | Curran | 437/31 |
| 4,729,941 | 3/1988 | Itoh et al. | 430/331 |
| 4,749,440 | 6/1988 | Blackwood et al. | 216/73 |
| 4,777,119 | 10/1988 | Brault et al. | 430/296 |
| 4,810,613 | 3/1989 | Osuch et al. | 430/192 |
| 4,857,142 | 8/1989 | Syverson | 216/58 |
| 4,983,490 | 1/1991 | Durham | 430/169 |
| 5,114,826 | 5/1992 | Kwong et al. | 430/192 |
| 5,129,955 | 7/1992 | Tanaka | 134/2 |
| 5,175,124 | 12/1992 | Winebarger | 437/180 |
| 5,209,858 | 5/1993 | Heinsohn et al. | 252/1 |
| 5,223,083 | 6/1993 | Cathey et al. | 216/71 |
| 5,234,540 | 8/1993 | Grant et al. | 216/63 |
| 5,271,798 | 12/1993 | Sandhu et al. | 216/73 |
| 5,350,714 | 9/1994 | Trefonas, III et al. | 437/229 |
| 5,374,503 | 12/1994 | Sachdev et al. | 430/323 |
| 5,395,482 * | 3/1995 | Onda et al. | 216/73 |
| 5,439,553 | 8/1995 | Grant et al. | 216/58 |
| 5,439,564 | 8/1995 | Shimizu et al. | 204/102 |
| 5,555,902 | 9/1996 | Menon | 134/199 |
| 5,576,831 | 11/1996 | Nikoonahad et al. | 356/375 |
| 5,576,833 | 11/1996 | Miyoshi et al. | 356/394 |
| 5,646,452 | 7/1997 | Narimatsu | 257/797 |
| 5,783,495 | 7/1998 | Li et al. | 438/738 |
| 6,054,062 * | 4/2000 | Calio et al. | 216/57 |
| 6,065,481 * | 5/2000 | Fayfield et al. | 134/1.3 |
| 6,203,623 * | 3/2001 | Xia | 134/1 |

* cited by examiner

METHOD AND APPARATUS FOR ETCH OF A SPECIFIC SUBAREA OF A SEMICONDUCTOR WORK OBJECT

BACKGROUND OF THE INVENTION

The present invention relates to a method for selective etching of a sub-area of a substrate during the fabrication of a semiconductor object. More particularly, it relates to the etching of an oxide layer on a silicon-based semiconductor wafer using vapors from a reagent that is the source for a reactive species of fluorine. It particularly relates to use of hydrogen fluoride (HF) vapors. The invention further relates to an apparatus for selectively etching a selected area of a substrate. More particularly, the invention relates to an apparatus and method for etching material from alignment markers on a silicon wafer.

The fabrication of integrated circuits on silicon wafers uses many differing processes and materials. For instance, photolithographic techniques are used to pattern the various gates on the silicon chip. As sophisticated pattern definition technologies have been developed, the geometry of integrated circuit components has shrunk from the six-micron size of the 1970s, to the sub-micron technologies of the late 1980's, to the deep sub-micron regions of the 1990s. Therefore, it has become increasingly important to carefully align the wafer during semiconductor device manufacturing processes. Also, as the size of the features of the integrated circuits have become increasingly smaller and the spacing of the features of the semiconductor devices has decreased on the wafer, of necessity, the size of any predetermined area of the wafer containing any feature or circuit component on the wafer has decreased. This is the case for the alignment markers on the wafer used to align the wafer during manufacturing processes.

The alignment marks can easily become covered or contaminated with various materials during processing steps. For example, after photoresist material is applied to the wafer in a circuit forming process and the subsequent etching of the wafer to form the desired circuit, the wafer's alignment markers may remain covered with photoresist material or subsequently deposited oxide material. Such material must be removed prior to the continued processing of the wafer. If it is not, optical wafer alignment systems may not find the alignment markers. Therefore, alignment markers on the wafer must be cleaned before any subsequent processing occurs to ensure proper alignment of the wafer on the process equipment.

It is difficult to remove such material from the alignment markers because the alignment markers have a pattern forming low trenches where the undesired material resides. While mechanical polishing removes photoresist and oxide materials from the plane surface of the wafer, the material in the trenches is not easily removed by polishing.

Therefore, it is desirable to have a method and apparatus for cleaning predetermined areas of the wafer, such as the alignment marks on a wafer.

In U.S. Pat. No. 5,271,798, owned by the assignee of the present invention, and hereby incorporated by reference as if set forth herein in its entirety, method and apparatus are illustrated for the cleaning of alignment markers on a wafer. The apparatus uses a cylindrical containment nozzle that engages the area surrounding an alignment marker on a wafer. When the nozzle is sealed against the wafer, an etchant is dispensed over the alignment marker. The etchant is removed from the alignment mark by suction applied though the nozzle. This prior art method and apparatus requires the nozzle to physically contact the wafer to form a seal around the alignment mark. A similar concept is disclosed in Ser. No. 08/916,997 entitled "Method and Apparatus for Selective Removal Of Material From Wafer Alignment Marks", filed Aug. 20, 1997, which is commonly owned by the assignee of the present invention, and which is hereby incorporated by reference as if set forth herein in its entirety.

That patent application also discloses a process and apparatus for removing material from a predetermined area, such as an alignment marker. The etching apparatus uses a nozzle for dispensing etchant onto the alignment marker. The nozzle can form a "virtual seal" with the wafer that is based on close but not actual physical contact with the wafer. The virtual seal is intended to overcome any concern that the nozzle may damage the wafer through physical contact. The virtual seal works by creating a lower pressure in the nozzle than the pressure of the surrounding atmosphere so that the nozzle draws in atmospheric air. By maintaining a lower pressure in the nozzle, etchant dispensed through the nozzle does not escape the nozzle.

In both the aforementioned patent application and the '798 patent, the containment nozzle has a tubular member disposed concentrically within an outer annular member for surrounding an alignment marker. Etchant is dispensed through the tubular member onto the wafer. Etchant is removed through an annular space between the tubular member and the outer annular member by suction.

In practice, the aforementioned methods and systems have been used with liquid etchants. The liquid etchants are delivered under positive pressure onto the wafer surface. The etchant is then removed under a relatively high vacuum to keep it from escaping the nozzle containment area. One significant is problem with liquid etchants delivered through prior art apparatus is that the liquid etchants are transported outside the containment nozzle because of surface tension forces. This is true even for virtual-seal nozzles applying a negative pressure. The liquid etchant spilling outside the nozzle containment area can damage features and circuits on the wafer. Therefore, there is a need for improved liquid dispensation systems that minimize or prevent etchants from spilling outside the nozzle.

Another problem with existing methods and systems arises from the fact that they use a positive pressure to dispense a liquid etchant onto the wafer. Because of the use of positive pressure, if the nozzle's seal fails, liquid will continue to be dispensed under pressure spilling or spraying outside the nozzle onto the wafer and surrounding equipment. Such spillage may not only damage the wafer but it also poses a safety risk to equipment that may be exposed to highly corrosive and toxic etchants.

A related disadvantage of prior art systems is that such systems do not inherently shut down if a seal fails. Therefore, if a seal does fail, the positive pressure will continue driving the etchant from the containment nozzle until there is a shutdown. Accordingly, added features must be incorporated into the system to shut it down in case of seal failure.

A further problem in existing system arises from the concentric arrangement of the containment nozzle described above. This arrangement does not allow optimal flow of etchant on the selected surface on the wafer or optimal contact time with the surface. This can lead to irregularities in the etched surface due to incomplete or over-etching.

In view of the foregoing problems and disadvantages, there is a need for improved methods and systems for processing selected areas of a wafer. In particular, there is a need for improved methods and systems directed at etching alignment markers of any material, including photoresist materials, chemical-mechanical-planarization process materials, and refractory metals.

SUMMARY OF THE INVENTION

The present invention overcomes the disadvantages of the prior art by providing a dynamic-flow system that processes a selected area of a semiconductor work object (e.g., a silicon wafer) without delivering the processing agent (e.g. an etchant) to the surface of the work object under a positive pressure. The present invention instead uses a vacuum to pull a processing agent through a nozzle onto the surface of the work object. The source of the processing agent can only communicate with the vacuum, and be pulled onto the wafer surface, when the nozzle is sealed against the work object. Therefore, the processing agent is dispensed onto the surface of the wafer or other work object by a single motive force that draws the processing agent from its source onto a wafer and then removes it from the wafer. This is in contrast to prior art systems where there is a pressure source for dispensing the processing agent that can dispense the processing agent independently of the vacuum source for removing the processing agent. In basic terms, the processing agent is pulled through the system as opposed to being pushed and pulled through the system.

The negative pressure system presents less risk of leakage beyond the selected area covered by the containment nozzle during processing if the seal is acting marginally. The dispensation of the processing agent is also self-stopping in the event that the seal of the nozzle against the work object fails. The negative pressure system is therefore safer to the wafer, people, and equipment if the seal acts marginally or fails.

In another novel aspect, the present invention uses a vaporized processing agent in conjunction with the negative pressure system. Thus, the present invention overcomes the disadvantages inherent in the use of a liquid etchant. Relative to a liquid processing agent, a vaporized processing agent is less likely to escape the containment nozzle. A vaporized processing agent eliminates or minimizes the amount of liquid in the containment in the nozzle. So there is less chance that the processing agent will leak beyond the nozzle due to transport by surface tension forces. A vapor-based system also means that there should be fewer by-products and residues on the wafer following processing. Therefore, a wet rinse of the work object after processing is not required, but is an option.

Another advantage of the present invention is that it provides a novel "cross-flow" nozzle for dispensing a processing agent onto a selected area of a work object. The nozzle of the present invention has a configuration that establishes a dynamic flow of processing agent across the surface of a work object. The cross-flow more uniformly dispenses and moves the processing agent on the work object and maximizes the contact time of the processing agent at the surface of the work object. Thus, the cross-flow nozzle advantageously produces more efficient and uniform process results, including better control of etching depth.

In one embodiment the present invention provides a method for processing a selected area of a work object comprising: sealably engaging a nozzle for dispensing a processing agent over a selected area of the work object, the nozzle having a vacuum bore and a dispensing bore, the dispensing bore being in communication with a source for the processing agent and the vacuum bore being in communication with a vacuum source, the vacuum bore and dispensing bore being in communication with each other when the nozzle is sealably engaged over the selected area of the work object; and applying a predetermined vacuum through the vacuum bore so that there is a flow of processing agent from the processing agent source, through the dispensing bore, into contact with the selected area of the work object, and through the vacuum bore; and continuing the flow of processing agent until the selected area of the work object has been processed to a predetermined degree by the processing agent.

In another embodiment, the present invention provides a method of etching a wafer comprising: sealably engaging a dispensing nozzle for dispensing an etchant vapor over an alignment marker on the wafer, the nozzle having a vacuum bore and a dispensing bore, the dispensing bore being in communication with an etchant source and the vacuum bore being in communication with a vacuum source, the vacuum bore and dispensing bore being in communication with each other when the nozzle is sealably engaged over the alignment marker; activating the vacuum to create suction in the nozzle so as to cause a liquid etchant in the etchant source to vaporize, the vacuum pulling the vapors from the etchant source through the dispensing bore into contact with the selected area of the wafer; the etchant being removed through the vacuum bore; and continuing dispensation of the etchant vapors onto the selected area of the wafer until the selected area of the wafer has been processed to a predetermined degree by the processing agent.

In another embodiment, the present invention provides a system for processing a selected area of a work object comprising: a dispensing nozzle for dispensing a processing agent onto a selected area of the work object, the nozzle having a vacuum bore and a dispensing bore, the dispensing bore being in communication with a processing agent source and the vacuum bore being in communication with a vacuum source, the nozzle including a portion for sealably engaging a selected area of the work object so that when a predetermined vacuum is applied through the vacuum bore, a processing agent is drawn from the processing agent source through the dispensing bore into contact with the selected area of the work object; and a processing agent source comprising a vessel for holding the processing agent, the vessel being in communication with a gas source so that a vacuum from the vacuum source pulls the gas from the gas source into the vessel to form a vaporized etchant that is pulled through the dispensing bore into contact with the work object.

In another embodiment, the present invention provides a system for processing a selected area of a work object comprising: a dispensing nozzle for dispensing a processing agent onto a selected area of the work object, the nozzle having a vacuum bore and a dispensing bore, the dispensing bore being in communication with a processing agent source and the vacuum bore being in communication with a vacuum source, the nozzle including a portion for sealably engaging a selected area of the work object so that when a predetermined vacuum is applied through the vacuum bore, a processing agent is drawn from the processing agent source through the dispensing bore into contact with the selected area of the work object, the dispensing bore and vacuum bore being disposed in the nozzle so that there is a substantially unidirectional cross flow of processing agent across the selected area of the work object; and a processing agent source comprising a vessel for holding the processing agent, the vessel being in communication with a gas source so that a vacuum from the vacuum source pulls the gas from the gas source into the vessel to form a vaporized etchant that is pulled through the dispensing bore into contact with the work object.

In another embodiment, the present invention provides a system for processing a selected area of a work object comprising: a dispensing nozzle for dispensing a processing agent onto a selected area of the work object, the nozzle having a vacuum bore and a dispensing bore, the dispensing bore being in communication with a processing agent source and the vacuum bore being in communication with a vacuum source, the nozzle including a portion for sealably engaging a selected area of the work object so that when a predetermined vacuum is applied through the vacuum bore, a processing agent is drawn from the processing agent source through the dispensing bore into contact with the selected area of the work object; and a processing agent source comprising a vessel for holding the processing agent, the vessel being adapted so that upon activation of the vacuum source, a gas external to the vessel will be drawn into a port of the vessel to vaporize the liquid processing agent, the vacuum pulling the vapors from the vessel through the dispensing bore into contact with the work object.

In another embodiment, the present invention provides a nozzle for dispensing a processing agent onto a selected area of a wafer, the nozzle including a vacuum bore and a dispensing bore, the nozzle being adapted to cover the selected are so that processing agent dispensed by the nozzle is confined substantially to the selected area.

In one or more of the embodiments described herein, the vacuum may pull the vapors from the processing agent source through the dispensing bore into contact with the work object. In one or more of the embodiments described herein, the processing agent is an etchant. In one or more of the embodiments described herein, the etchant is aqueous HF or other source of reactive species of fluorine, as is known in the art. The reactive species of fluorine may also be provided in gas or vapor phase. In one or more of the embodiments described herein, the vacuum promotes the vaporization of the HF solution. In one or more of the embodiments described herein, the etchant comprises a liquid in a vessel, the vessel being in communication with a gas source so that the vacuum pulls the gas into the vessel to form a vaporized etchant that is pulled through the dispensing bore into contact with the work object. In one or more of the embodiments described herein, the work object is a wafer. In one or more of the embodiments described herein, the etchant is HF. In one or more of the embodiments described herein, the selected area of the work object comprises a silicon oxide surface.

In one or more of the embodiments described herein, the method may include the step of creating a temperature differential between the processing agent and the work object so that a temperature differential of about 10° C. to about 70° C. exists at the time the processing agent is dispensed onto the work object. In one or more of the embodiments described herein, the work object is at the lower end of the temperature differential, said differential being at least about 40° C. In one or more of the embodiments described herein, the work object temperature is less than about 30° C. In one or more of the embodiments described herein, the method includes the step of creating a temperature differential between the vaporized etchant and the wafer so that a temperature differential of at least about 40° C. exists at the time the vaporized etchant is dispensed onto the wafer. In one or more of the embodiments described herein, the wafer is at the lower end of the temperature differential, the wafer having a temperature of less than about 30° C. In one or more of the embodiments described herein, the wafer, temperature is less than about 20° C. when etchant is dispensed onto the wafer. In one or more of the embodiments described herein, the wafer temperature is about 10° C. to about 20° C. In one or more of the embodiments described herein, the etchant is at least about 60° C. when it contacts the wafer.

In one or more of the embodiments described herein, the gas source external to the vessel holding the etchant comprises air. In one or more of the embodiments described herein, the gas from the external gas source is bubbled through the liquid to produce the vaporized etchant.

In one or more of the embodiments described herein, the selected area comprises one or more alignment markers on a wafer. In one or more of the embodiments described herein, a separate nozzle for dispensing the etchant is provided for each alignment marker on the wafer.

In one or more of the embodiments described herein, the flow of processing agent across the selected surface moves substantially unidirectionally from about one side of the selected area to about another side. In one or more of the embodiments described herein, the dispensing bore and vacuum bore are disposed in the nozzle so that there is a substantially unidirectional cross flow of processing agent across the selected area of the work object. In one or more of the embodiments described herein, the dispensing bore and the vacuum bore are disposed substantially parallel to each other and at opposing sides of the nozzle.

In one or more of the embodiments described herein, an alignment marker is covered by a layer comprising silicon oxide and the processing agent is an etchant. In one or more of the embodiments described herein, the nozzle seal is a virtual seal. In one or more of the embodiments described herein, the method includes the step of creating a temperature differential between the vaporized etchant and the wafer so that a temperature differential exists at the time the vaporized etchant is dispensed onto the wafer, the wafer being at the lower end of the temperature differential said differential being greater than about 50° C. In one or more of the embodiments described herein, the wafer temperature is about 20° C. to about 30° C. In one or more of the embodiments described herein, the etchant is at about 60° C. to 90° C. when it contacts the wafer. In one or more of the embodiments described herein, the gas from the gas source is bubbled through the liquid to produce the vaporized etchant.

In one or more of the embodiments described herein, the system includes a wafer holder. In one or more of the embodiments described herein, the system includes a comprising means for positioning a nozzle over the selected area on the wafer. In one or more of the embodiments described herein, the system includes means for controlling the temperature of a wafer in the wafer holder. In one or more of the embodiments described herein, the system includes means to control the temperature of processing agent dispensed onto the selected area of a wafer in the wafer holder. In one or more of the embodiments described herein, the gas from the gas source is introduced into etchant in the vessel through a bubbler so as to produce vaporized etchant. In one or more of the embodiments described herein, the positioning means is adapted to position the nozzle over an alignment marker on a wafer in a wafer holder.

In one or more of the embodiments described herein, the selected area comprises an alignment marker on a wafer, and the nozzle is adapted to cover the alignment marker so that processing agent dispensed by the nozzle is confined substantially to the alignment marker area.

BRIEF DESCRIPTION OF THE DRAWINGS

FIG. 2 shows a sectional view of one embodiment of a nozzle used in the system and method of the present invention.

FIG. 2.1 shows an alternative embodiment of the nozzle of FIG. 2.

DETAILED DESCRIPTION OF THE INVENTION

The principles of the present invention enable the delivery of a processing agent in a gas, liquid or vapor phase (hereinafter collectively referred to as "fluids") to a selected area of a semiconductor work object to accomplish a process on the selected area. As used herein, "processing agent" means a substance for effecting some kind of chemical process on a wafer, including etch and deposition processes. As used herein, "work object" means wafers (production, dummy, or pmon), die and packaged parts, incorporating, in whole or part, silicon substrates, and other known or discovered semiconductor materials, components, and assemblies, including, for example, silicon-on-insulator (SOI), silicon-on-sapphire (SOS), thin film transistor (TFT) materials, or germanium, periodic group III-IV materials, II-VI materials, hetero-materials (II, III, V, VI), and conductive glasses.

It will be apparent to persons of skill in the art that the present invention is not limited to any particular work object or to the delivery of a particular processing agent to a selected area of the work object. However, to illustrate the principles of the present invention, the following discussion, unless otherwise noted, will be in terms of a silicon-based wafer as the work object; alignment markers on the wafer as the selected area on the wafer to be processed; and an etchant as the processing agent delivered to the selected area.

Figure 1:
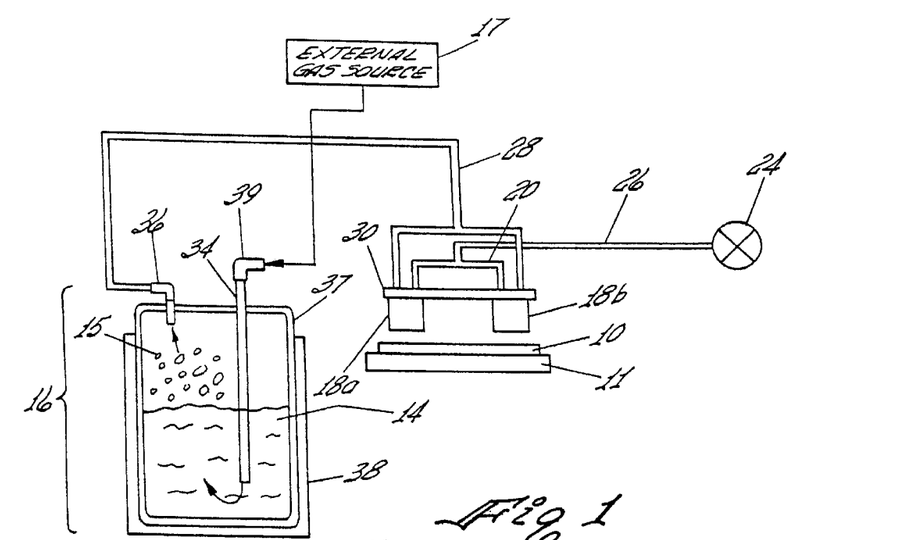
FIG. 1 shows an overview of a system according to the present invention for processing a selected area of a semiconductor work object.

FIG. 1 shows a system for processing a selected area of semiconductor wafer 10. The wafer 10 includes a top layer of material 12 that is to be etched and an underlying substrate layer 13 that is to be uncovered. The wafer 10 is mounted in a wafer holder 11 for securing the wafer. The wafer holder 11 may include known means for heating or cooling the wafer. For example, the wafer holder device could incorporate electrical heating elements or channels for flow of a heated or cooled fluid.

Figures 2, 21:
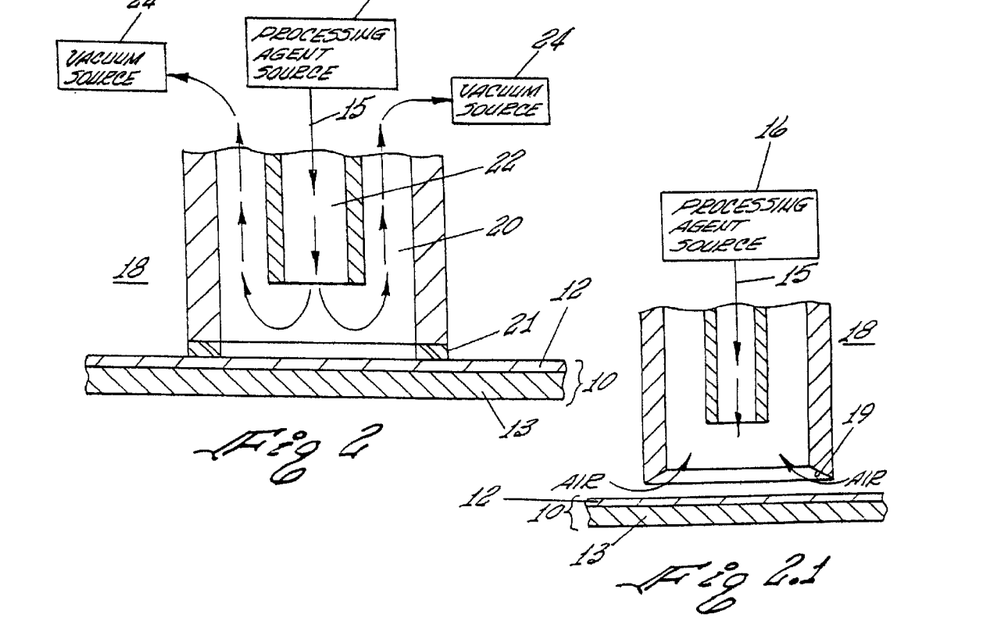

An etchant 14 from an etchant source (or other source of processing agent) 16 is applied through one or more dispensing nozzles 18a and 18b to one or more selected areas of wafer 10. Each nozzle has individual in and out paths. Each nozzle provides enough of a seal against the wafer so that a vacuum applied through the out-path will draw a fluid etchant from an etchant source through the in-path onto the wafer. Preferably, the fluid is a vapor of the etchant, alone or in combination with other vaporized or gaseous substances. Accordingly, each nozzle 18 includes at least one vacuum bore 20 for channeling fluid into nozzle 18 and at least one dispensing bore 22 through which the fluid is pulled. The bores may be formed of relatively elongated tubular structures. As discussed below, the bores are not limited to any particular cross-section. In the embodiments shown in FIGS. 2 and 2.1, dispensing bore 22 is concentrically disposed within vacuum bore 20. The annular walls of the vacuum bore 20 define the outer walls of nozzle 18. Also, note that the lower end of the tube defining bore 22 does not extend as far as the tube defining bore 20. The space between the end of tube 22 and the surface of wafer 10 allows fluid dispensed from bore 22 to be delivered in adequate amounts, and to spread unimpeded, across the full surface area of the region defined by the inner perimeter of the annular tube defining bore 20. This perimeter may also be referred to as the "nozzle containment" area.

The lower end of the nozzle 18 is adapted to engage the surface of wafer 10 and seal against it. Nozzle 18 may optionally include a resilient contact gasket 21, which is of a soft, resilient material that reduces the likelihood that the nozzle will damage wafer 10 upon contact. Nozzle 18 defines the flow path of a processing agent onto and off wafer 10. Physical contact between nozzle 18 and wafer 10 is not necessary for nozzle 18 to form a seal against wafer 10. The seal may be a "virtual seal": when the vacuum bore 20 is under a sufficient vacuum, fluid introduced through dispensing bore 22 will not escape the periphery of nozzle 18 because the pull of the vacuum draws the atmosphere surrounding nozzle 18 therewithin. FIG. 2.1 shows a preferred configuration for forming a virtual seal: a nozzle having a thin annular edge 19.

Figure 3:
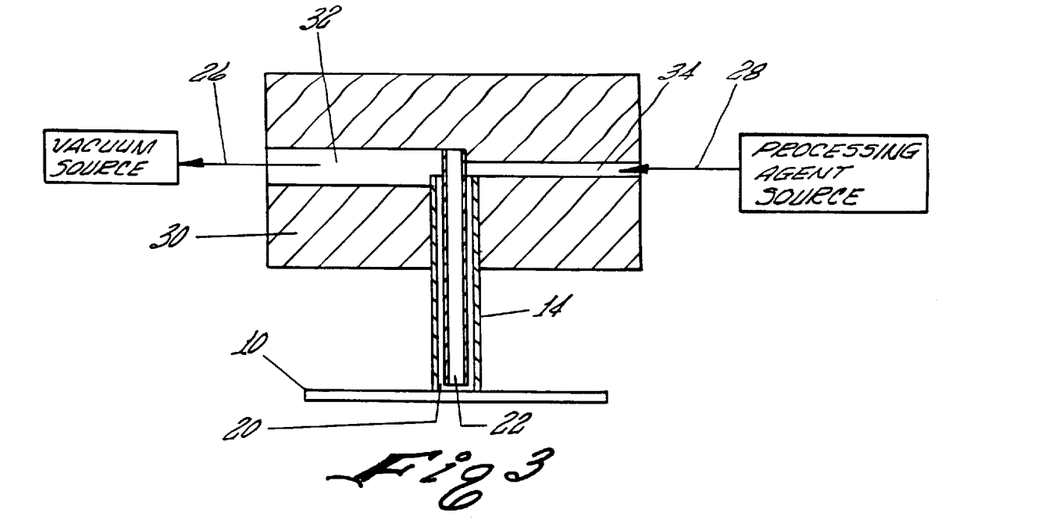
FIG. 3 shows a sectional view of a head and nozzle used in the system and method of the present invention.

A head 30 may be provided for holding one or more nozzles 18, as shown in FIG. 1. For each nozzle, head 30 provides at least one channel 32 for communication with vacuum line 26 and at least one channel 34 for communication with fluid line 28. The upper end of nozzle 18 is integral with head 30. Nozzle 18 may be a separate unit attached to head 30 by known attachment means including chemical bonding, screw threads, welding, or other known attachment means. The nozzle 18 and head 30 may also be of a unitary construction of one or more materials, as shown in FIG. 3. A unitary construction could be formed by known molding or casting techniques, for example. Head 30 with nozzles 18 could also be formed mechanically by, for example, drilling desired channels and bores into a piece of suitable material.

The nozzle 18 and head 30 may be formed of any number of materials, including metals and polymers. It is well within the domain of persons skilled in the art to choose materials that are compatible with contemplated etchants or other desired processing agents and process conditions. For example, where HF gas is the etchant for cleaning alignment markers of an oxide layer, preferred materials include ultra high molecular weight polyethylene, PVDF (polyvinylidenefluoride), Teflon®, and Teflon® PFA (perfluroalkoxy).

The processing agent and any reaction by-products or residues are removed by suction through vacuum bore 20. Vacuum bore 20 is in communication with a vacuum source 24 by vacuum line 26. The vacuum source 24 may be any number of known means for creating suction or a vacuum, including conventional pump systems and venturi systems. Dispensing bore 22 is in communication with etchant source 16 by fluid line 28. As can be seen in the drawings the vacuum line 26 and fluid line 28. During operation of the invention, as discussed in more detail below, there is a dynamic flow, with vaporized etchant being introduced onto the wafer 10 though dispensing bore 22 and continuously being removed through vacuum bore 20.

The nozzle 18 may have any desired cross-sectional shape, including circular, oval, square, polygonal, etc. The shape, however, should be suitable to surround the selected area of the wafer to be processed. Preferably, the shape closely matches and fits the shape of the selected area of the wafer so that there is not etching of the area beyond the selected area. The vacuum bore 20 and dispensing bore 22 may also have the foregoing cross-sectional shapes so long as they allow flow of liquid, vapor, or gas processing agents to be used. An alignment marker on a wafer has a defined shape such as a square or circle that, at least for certain applications, fits in an area of approximately 0.5 mm–1.0 mm diameter. A containment nozzle can readily be made by persons skilled in the art to surrounds such area. Nozzles of varying sizes and shapes can also be used if they do not overlap areas not desired to be treated by the etchant.

In operation, a nozzle 18 is actually or virtually engaged against a selected area of wafer 10. Wafer holder 11 may be adapted to lift the wafer 10 into sealing engagement with the dispensing nozzles 18. Alternatively, head 30 may be moved to place nozzles 18 into sealing engagement with the selected areas on wafer 10. In either case, nozzle 18 may be spring loaded to keep nozzle 18 from forcefully contacting the wafer's surface. In the case of alignment markers, machinery known in the art may be programmed or otherwise adapted to position nozzles 18 over the markers.

The application of a vacuum force through vacuum bore 20 creates a positive seal between nozzle 18 and wafer 10. This seal places the vacuum into communication with dispensing bore 22. Because dispensing bore 22 is in communication with etchant source 16 via fluid line 28, the vacuum pulls etchant from the etchant source 16 through the dispensing bore 22 and into contact with the selected area of the wafer 10. The etchant and any etchant byproducts are continuously removed from the surface of wafer 10 through suction bore 20 by the vacuum applied force applied therethrough.

The details of an etchant source 16, adapted for delivering a vaporized etchant vapor 15 to wafer 10, are shown in FIG. 1. In a system for delivering a vaporized etchant to a selected area on a wafer, the dispensing bore and vacuum bore of nozzle 18 can be small relative to a liquid delivery nozzle. This is because vapors pass more easily through structures of smaller size. Etchant source 16 includes a vessel 37 for holding a liquid solution of etchant 14. The etchant solution 14 may be any vaporizable etchant. The etchant solution 14 could also contain one or more other components used in the processing of wafer 10. For example, it could contain an etch-reducing component. Certain etch reducing components are described in U.S. Pat. No. 5,783,495, which is owned by the assignee of the present invention and hereby incorporated by reference as if set forth in its entirety.

The reaction rate of an etchant generally increases with temperatures over at least a selected range of temperatures. Therefore, vessel 37 may optionally include a heating jacket 38 with known means to heat or cool the etchant solution. In a heated system, vessel 37 should also include a pressure relief valve so that pressure in the vessel can be safely controlled during heating.

The vessel 37 includes a bubbler tube 34 to flow a gas 17 through solution 14 to help produce a vapor of etchant 15 above solution 14. The gas 17 could also flow over top of solution 14 to create vapor 15. The bubbler tube 34 may be made from any material known to compatible with the solutions, gases, and process conditions used. Suitable materials may include PVDF and others mentioned above for the construction of head 30 and nozzle 18. The tube 34 should include perforations for the gas to flow into the liquid.

The bubbler tube 34 may be connected to a gas intake port 39 in vessel 37. Intake port 39 is in communication with a source for gas 17. In FIG. 1, the intake port is in communication with the atmosphere external the vessel ("atmospheric air"), for example the air in the fabrication room. In such case, solution 14 is bubbled with air. Intake port 34 may include a regulator valve that is opened upon an appropriate vacuum applied on vessel 37, letting gas 17 into vessel 37. Intake port 34 could also be communication with any other desired gas source. The gas 17 could be one or more inert gases such as nitrogen. Or it could be one or more gases used to process the wafer. For example, gas 17 could be the gaseous form of the etchant in solution 14, one or more other etchants, or other process gas. For example, gas 17 could be anhydrous HF, another hydrogen halide gas, such as HCL, ozone, etc. If such gases were kept in pressurized cylinders at higher pressure than vessel 37, an appropriate regulator valve (not shown) would be used. (Such regulator valves are known to persons skilled in the art.)

Vessel 37 includes a vapor outlet port 36 in communication with etchant vapor 15 above etchant solution 14. The fluid line 28 is connected to outlet port 36. The port may include a tube that extends into vessel 37 for directing vapors to outlet port 36. If delivery of a liquid processing agent is desired, the tube may extend into etchant solution 14. When fluid line 28 is under a vacuum, gas 17 is pulled through port 39 and the bubbler tube 34 and into the solution to produce etchant vapor 15. The vacuum then pulls the vapor through outlet port 36 into line 28, which delivers the vapor 15 to the wafer. The vacuum may be kept active until the wafer has been etched a desired degree.

The foregoing method is believed to be suitable to etch native, thermal, or deposited oxides having a thickness of up to and exceeding 8000 Å thickness. The invention is also capable of over-etching the oxide to etch underlying materials such as nitrides.

The intake port 39 may include valves to regulate the flow of fluid through the system at desired connection or delivery systems. The valves may be manually regulated or regulated by automation, e.g. a computer processor.

Etchant used in semiconductor process steps include hydrogen fluoride (HF), nitric acid, hydrogen peroxide, and ammonium fluoride. These substances may be applied in various phases, including liquid, liquid-vapor, or gas phases, as is known in the art. A preferred etchant for removing deposits of silicon oxide species is HF vapor. HF is also capable of removing nitride layers used in certain processing steps. The HF used in semiconductor processing is generally available as an aqueous solution. Such solutions may be obtained from commercial sources as 49% HF in 51% $H_2O$. Any other desired percentage of HF in aqueous solution could also be used. Other processing agents could also be included in the solution to achieve a desired effect.

The vapor may be produced from a solution of HF using well known techniques including bubbling a gas through the etchant solution, heating the solution, dispensing the solution through ultrasonic jets, etc. A preferred method of producing a vapor by bubbling is discussed below.

Figure 4:
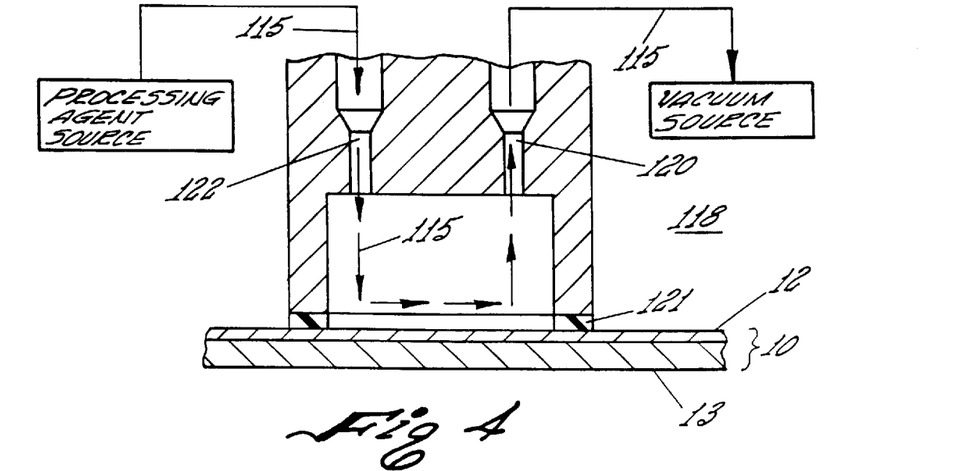
FIG. 4 shows a sectional view of an alternative embodiment of a nozzle used in the system and method of the present invention.

FIG. 4 shows an alternative embodiment of a nozzle 118 for creating a cross-flow of etchant or other processing agent that moves in a substantially unidirectional path from along the selected surface area. The path is defined by the location of the dispensing bore 122 and vacuum bore 120 in the nozzle 118. To create a unidirectional cross-flow of etchant across substantially the entire surface of the selected area of wafer 10, the lower openings of vacuum bore 120 and dispensing bore 122 are disposed on opposite sides of nozzle 118. In one possible embodiment, dispensing bore 122 and the vacuum bore 120 are vertically disposed substantially parallel to each other in nozzle 118. The bores are perpendicularly oriented relative to the surface of wafer 10. Thus, when vacuum is applied there is a substantially unidirectional cross-flow of vapor etchant 115 from dispensing bore 122, along the surface of the wafer 10, to the vacuum bore 120. This system could also be used to apply a liquid etchant 114. The embodiment of FIG. 4 is suitable for use in the system of FIG. 1.

The advantage of a cross-flow nozzle is that it more uniformly delivers a processing agent across the surface of the selected area of the wafer. This can produce a more even etch of layer 12 and better control of the etch depth. The cross-flow arrangement also helps direct the etchant flow so that it does not flow beyond the periphery of the nozzle onto non-selected areas of the wafer. As in other embodiments, the nozzle 118 and head 30 may be of a unitary piece or formed of separate pieces. Nozzle 118 may also include a resilient contact gasket 121. The nozzle 118, vacuum bore 120 and dispensing bore 122 may also have various cross-sections, as described for the embodiment of FIG. 2. It is also worth noting that it is easier to construct a nozzle with parallel dispensing and vacuum bores, as shown in FIG. 4, than to construct a nozzle using concentric bores, as shown in FIG. 2. The parallel bores can be formed in a piece of material by, for example, drilling or boring a piece of material.

Figure 5:
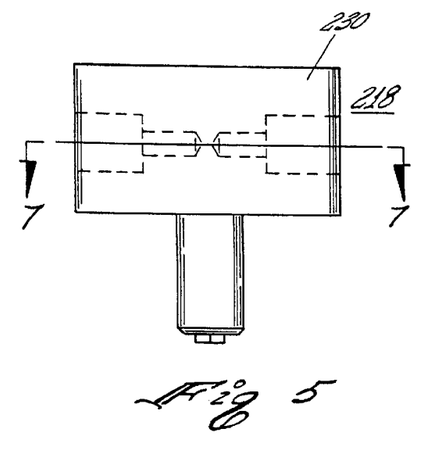
FIG. 5 shows an elevation view of an embodiment of a nozzle for the present invention.
Figure 6:
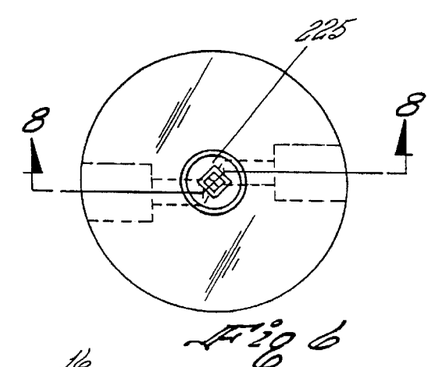
FIG. 6 shows a bottom view of the embodiment of FIG. 5.
Figure 7:
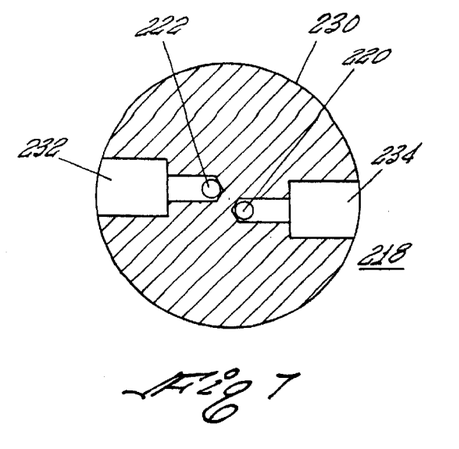
FIG. 7 shows a top sectional view of the embodiment of FIG. 5 taken along line 7—7.
Figure 8:
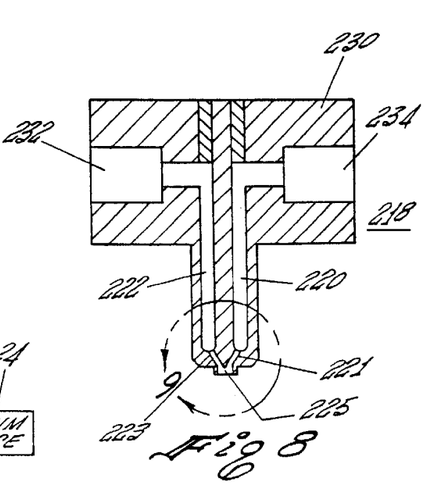
FIG. 8 shows a side sectional view of the embodiment in FIG. 6 taken along line 8—8.
Figure 9:
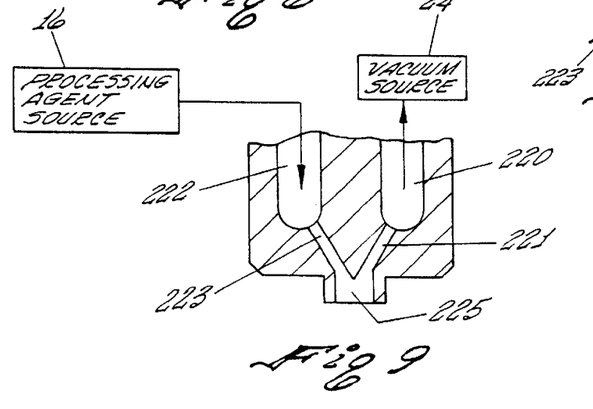
FIG. 9 shows an enlargement of the area of circle 9 in FIG. 8.

FIGS. 5–9 show an alternative embodiment of a nozzle consistent with the foregoing principles of the present invention. Nozzle 218 has a vacuum bore 220 for communication with a vacuum source and a dispensing bore 222 for communication with a vapor source, similar to the nozzles of FIGS. 2–4. For each nozzle 218, a head 230 provides at least one channel 232 for communication with vacuum line 26 and at least one channel 234 for communication with fluid line 28. Bores 220 and 222 converge together at the lower end of the nozzle. Thus, bore 220 has a downwardly converging section 221. Bore 222 has a downwardly converging section 223. Converging sections 221 and 223 may have a reduced diameter relative to the upper sections of bores 220 and 222. The lower sections 221 and 222 meet at, and open into, the containment end 225 of nozzle 218. FIG. 5 is an elevation view of nozzle 218. FIG. 6 shows a bottom view of the embodiment of nozzle 218. FIG. 7 shows a top sectional view of nozzle 218 taken along line 7—7. FIG. 8 shows a side sectional view of nozzle 218 along line 8—8. FIG. 9 shows an enlargement of the area of circle 9 in FIG. 8.

Figure 10:
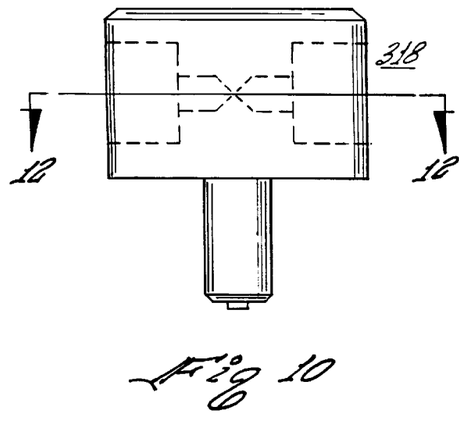
FIG. 10 shows an elevation view of another embodiment of a nozzle for the present invention.
Figure 11:
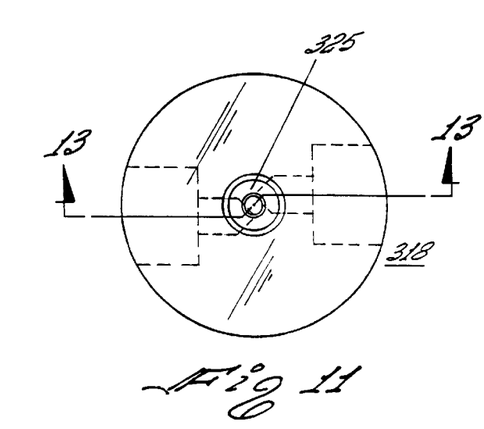
FIG. 11 shows a bottom view of the embodiment of FIG. 10.
Figure 12:
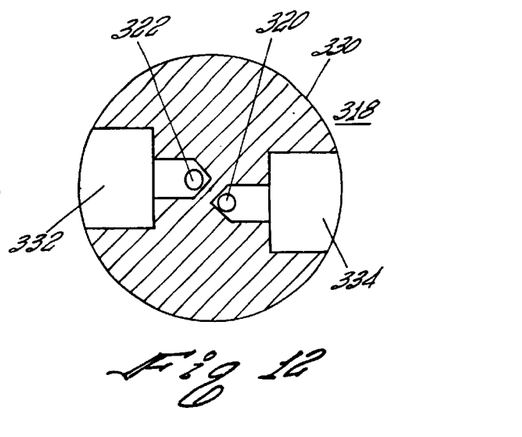
FIG. 12 shows a top sectional view of the embodiment of FIG. 10 taken along line 12—12.
Figure 13:
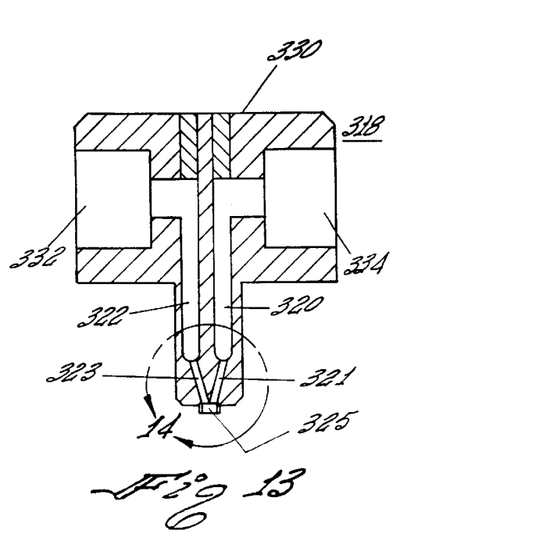
FIG. 13 shows a side sectional view of the embodiment in FIG. 11 taken along line 13—13.
Figure 14:
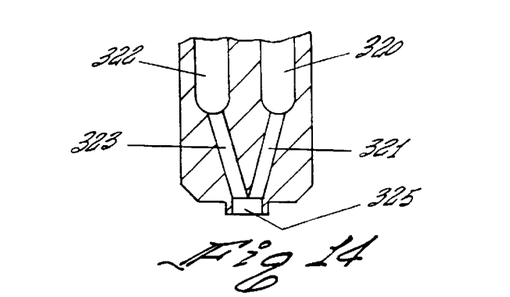
FIG. 14 shows an enlargement of the area of circle 14 in FIG. 13.

FIGS. 10–14 show an alternative embodiment of a nozzle consistent with the foregoing principles of the present invention. Nozzle 318 has a vacuum bore 320 for communication with a vacuum source and a dispensing bore 322 for communication with a vapor source, similar to the nozzles of FIGS. 2–4. For each nozzle 318, a head 330 provides at least one channel 332 for communication with vacuum line 26 and at least one channel 334 for communication with fluid line 28. Bores 320 and 322 converge together at the lower end of the nozzle. Thus, bore 320 has a downwardly converging section 321. Bore 322 has a downwardly converging section 323. Converging sections 321 and 322 may have a reduced diameter relative to the upper sections of bores 320 and 322. The lower sections 321 and 322 meet at, and open into, the containment end 325 of nozzle 318. FIG. 10 is an elevation view of nozzle 318. FIG. 11 shows a bottom view of the embodiment of nozzle 318. FIG. 12 shows a top sectional view of nozzle 318 taken along line 12—12 of FIG. 10. FIG. 13 shows a side sectional view of nozzle 318 along line 13—13 in FIG. 11. FIG. 14 shows an enlargement of the area of circle 14 in FIG. 13.

Turning now to process parameters, it has been found that over certain temperature ranges, etch rates generally improve as the temperature difference of the etchant increases relative to the temperature of the wafer, especially for condensable vapors. A practical temperature differential for many applications, including etching with HF vapor, is about 10° C. to about 80° C. In this differential, the temperature of the wafer should generally be from about 10° C. to about 70° C. The optimally range for an particular application will depend on various factors including the nature of the etchant or other processing agent selected for use and the temperature sensitivity of the structures being formed on the wafer. To conserve the thermal budget of the wafer, it is desirable to keep the wafer temperature below about 30° C. A temperature control system could be provided in association with wafer holder 11 to cool or heat the wafer, as well as to monitor the wafer's temperature. In terms of using HF vapor to etch silicon oxide deposited on a wafer in an HDP process, a preferred temperature of HF vapor is about 50° C. to about 90° C., with the wafer having a temperature of about 10° C. to about 30° C. A more preferred set of temperatures is about 15° C. to about 25° C. for the wafer and about 65° C. to about 75° C. for the source liquid (e.g. HF solution).

It is believed that etch rates generally improve by keeping the vacuum in the nozzle relatively low. However, the vacuum should not be so low that the containment nozzle does not effectively seal against the wafer or pull etchant onto and off the wafer. It is believed that lower vacuum levels improve the reside time of etchant on the wafer.

A purge of the nozzles and selected area on the wafer with air or other inert substance may also be performed to clear the wafer and system of etchant, residues, and by-products. It is believed that a purge of about five seconds was found to be useful. A Maragoni rinse/dry or other wet/dry rinse procedure may optionally be used, as well, to clear etchant, residues, and by-products from the wafer.

Persons skilled in the art will recognize the foregoing description and embodiments are not limitations but examples. It will be recognized by persons skilled in the art that many modifications and variations to the present invention are possible that are still within the spirit and scope of the teachings and claims contained herein.

What we claim:

1. A method for processing a selected area of a work object comprising:
   sealably engaging a nozzle for dispensing a processing agent over a selected area of the work object, the nozzle having a vacuum bore and a dispensing bore, the dispensing bore being in communication with a source for the processing agent, the processing agent source being in communication with a gas source, and the vacuum bore being in communication with a vacuum source, the vacuum bore and dispensing bore being in communication with each other when the nozzle is sealably engaged over the selected area of the work object;
   applying a vacuum through the vacuum bore so that there is a flow of processing agent from the processing agent source, through the dispensing bore, into contact with the selected area of the work object, and through the vacuum bore; and
   continuing the flow of processing agent until the selected area of the work object has been processed to a predetermined degree by the processing agent.

2. The method of claim 1 wherein the vacuum pulls the vapors from the processing agent source through the dispensing bore into contact with the work object.

3. The method of claim 1 wherein the processing agent is an etchant.

4. The method of claim 3 wherein the etchant comprises a reactive species of fluorine for etching a selected area of a work object.

5. The method of claim 4 wherein etchant comprises an aqueous solution of HF.

6. The method of claim 5 wherein the vacuum promotes the vaporization of the HF solution.

7. The method of claim 3 wherein the etchant comprises a liquid in a vessel, the vessel being in communication with a gas source so that gas acts on the liquid to form vaporized etchant that the vacuum pulls through the dispensing bore into contact with the work object.

8. The method of claim 7 wherein the work object is a wafer.

9. The method of claim 8 wherein the etchant is HF.

10. The method of claim 9 wherein the selected area comprises a silicon oxide surface.

11. The method of claim of claim 1, further comprising the step of creating a temperature differential between the processing agent and the work object so that a temperature differential of about 10° C. to about 70° C. exists at the time the processing agent is dispensed onto the work object.

12. The method of claim 11 wherein the work object is at the lower end of the temperature differential, said differential being at least about 40° C.

13. The method of claim 12 wherein the work object temperature is less than about 30° C.

14. The method of claim 7, further comprising the step of creating a temperature differential between the vaporized etchant and the wafer so that a temperature differential of at least about 40° C. exists at the time the vaporized etchant is dispensed onto the wafer.

15. The method of claim 14 wherein the wafer is at the lower end of the temperature differential, the wafer having a temperature of less than about 30° C.

16. The method of claim 15 wherein the wafer temperature is less than about 20° C.

17. The method of claim 11 wherein the wafer temperature is about 10° C. to about 20° C.

18. The method of claim 7 wherein the etchant is at least about 60° C. when it contacts the wafer.

19. The method of claim 18 wherein the wafer is less than about 20° C. when etchant is dispensed onto the wafer.

20. The method of claim 7 wherein the gas source comprises air.

21. The method of claim 7 wherein the gas from the gas source is bubbled through the liquid to produce the vaporized etchant.

22. The method of claim 21 wherein the gas comprises air.

23. The method of claim 7 wherein the selected area comprises one or more alignment markers on a wafer.

24. The method of claim 23 wherein a separate nozzle for dispensing the etchant is provided for each alignment marker on the wafer.

25. The method of claim 1 wherein the flow of processing agent across the selected surface moves substantially unidirectionally from about one side of the selected area to about another side.

26. The method of claim 1 wherein the dispensing bore and vacuum bore are disposed in the nozzle so that there is a substantially unidirectional cross flow of processing agent across the selected area of the work object.

27. The method of claim 26 wherein the dispensing bore and the vacuum bore are disposed substantially parallel to each other and at opposing sides of the nozzle.

28. The method of claim 26 wherein the selected area comprises an alignment marker on a wafer.

29. The method of claim 28 wherein the alignment marker is covered by a layer comprising silicon oxide and the processing agent is an etchant.

30. The method of claim 1 wherein the nozzle seal is a virtual seal.

31. A method of etching a wafer comprising:
    sealably engaging a dispensing nozzle for dispensing an etchant vapor over an alignment marker on the wafer, the nozzle having a vacuum bore and a dispensing bore, the dispensing bore being in communication with an etchant source and the vacuum bore being in communication with a vacuum source, the vacuum bore and dispensing bore being in communication with each other when the nozzle is sealably engaged over the alignment marker;
    activating the vacuum to create suction in the nozzle so as to cause a liquid etchant in the etchant source to vaporize by action of a gas from a gas source, the vacuum pulling the vaporized etchant from the etchant source through the dispensing bore into contact with the selected area of the wafer; the etchant being removed through the vacuum bore; and
    continuing dispensation of the etchant vapors onto the selected area of the wafer until the selected area of the wafer has been processed to a predetermined degree by the processing agent.

32. The method of claim of claim 31, further comprising the step of creating a temperature differential between the vaporized etchant and the wafer so that a temperature differential exists at the time the vaporized etchant is dispensed onto the wafer, the wafer being at the lower end of the temperature differential said differential being greater than about 50° C.

33. The method of claim 32 wherein the wafer temperature is about 20° C. to about 30° C.

34. The method of claim 31 wherein the etchant comprises HF.

35. The method of claim 32 wherein the etchant is at about 60° C. to 90° C. when it contacts the wafer.

36. The method of claim 31 wherein the etchant comprises a liquid in a vessel, the vessel being in communication with a gas source so that the vacuum pulls the gas into the vessel to form a vaporized etchant that is pulled through the dispensing bore into contact with the work object.

37. The method of claim 36 wherein the gas source comprises atmospheric air.

38. The method of claim 36 wherein the gas from the gas source is bubbled through the liquid to produce the vaporized etchant.

39. The method of claim 31 wherein the dispensing bore and vacuum bore are disposed in the nozzle so that there is a substantially unidirectional cross flow of etchant across the selected area of the work object.

40. A system for processing a selected area of a work object comprising:
a dispensing nozzle for dispensing a processing agent onto a selected area of the work object, the nozzle having a vacuum bore and a dispensing bore, the dispensing bore being in communication with a processing agent source and the vacuum bore being in communication with a vacuum source, the nozzle including a portion for sealably engaging a selected area of the work object so that when a predetermined vacuum is applied through the vacuum bore, a processing agent is drawn from the processing agent source through the dispensing bore into contact with the selected area of the work object; and
a processing agent source comprising a vessel for holding the processing agent, the vessel being in communication with a gas source so that a vacuum from the vacuum source pulls the gas from the gas source into the vessel to form a vaporized etchant that is pulled through the dispensing bore into contact with the work object.

41. The system of claim 40 further comprising a wafer holder.

42. The system of claim 41 further comprising means for positioning a nozzle over the selected area on the wafer.

43. The system of claim 41 further comprising means for controlling the temperature of a wafer in the wafer holder.

44. The system of claim 41 further comprising means to control the temperature of processing agent dispensed onto the selected area of a wafer in the wafer holder.

45. The system of claim 40 wherein the gas source comprises atmospheric air.

46. The system of claim 45 wherein the gas from the gas source is introduced into etchant in the vessel through a bubbler so as to produce vaporized etchant.

47. The system of claim 42 wherein the positioning means is adapted to position the nozzle over an alignment marker on a wafer in a wafer holder.

48. The system of claim 47 wherein a separate nozzle for dispensing the etchant is provided for each alignment marker on the wafer.

49. The system of claim 40 wherein the dispensing bore and vacuum bore are disposed in the nozzle so that there is a substantially unidirectional cross flow of processing agent across the selected area of the work object.

50. The system of claim 49 wherein the dispensing bore and the vacuum bore are disposed substantially parallel to each other in the nozzle, and the bores are disposed at about opposing sides of the nozzle.

51. The system of claim 40 wherein the selected area comprises an alignment marker on a wafer and the nozzle is adapted to cover the alignment marker so that processing agent dispensed by the nozzle is confined substantially to the alignment marker area.

52. The system of claim 40 wherein the nozzle is adapted to form a virtual seal with the wafer.

53. A system for processing a selected area of a work object comprising:
a dispensing nozzle for dispensing a processing agent onto a selected area of the work object, the nozzle having a vacuum bore and a dispensing bore, the dispensing bore being in communication with a processing agent source and the vacuum bore being in communication with a vacuum source, the nozzle including a portion for sealably engaging a selected area of the work object so that when a predetermined vacuum is applied through the vacuum bore, a processing agent is drawn from the processing agent source through the dispensing bore into contact with the selected area of the work object, the dispensing bore and vacuum bore being disposed in the nozzle so that there is a substantially unidirectional cross flow of processing agent across the selected area of the work object; and
a processing agent source comprising a vessel for holding the processing agent, the vessel being in communication with a gas source so that a vacuum from the vacuum source pulls the gas from the gas source into the vessel to form a vaporized etchant that is pulled through the dispensing bore into contact with the work object.

54. The system of claim 53 wherein the dispensing bore and the vacuum bore are disposed substantially parallel to each other in the nozzle, and the bores are disposed at about opposing sides of the nozzle.

55. The system of claim 54 further comprising means for controlling the temperature of the work object.

56. The system of claim 54 further comprising means to control the temperature of processing agent dispensed on the selected area of the work object.

57. The system of claim 54 wherein the gas source comprises atmospheric air.

58. The system of claim 54 wherein the work object comprises a wafer and the selected area comprises an alignment marker, the system further comprising means to position the nozzle over an alignment marker on the wafer.

59. The system of claim 58 wherein a separate nozzle for dispensing the etchant is provided for each alignment marker on the wafer.

60. The system of claim 54 wherein the selected area comprises an alignment marker on a wafer, and the nozzle is adapted to cover the alignment marker so that processing agent dispensed by the nozzle is confined substantially to the alignment marker area.

61. A system for processing a selected area of a work object comprising:
a dispensing nozzle for dispensing a processing agent onto a selected area of the work object, the nozzle having a vacuum bore and a dispensing bore, the dispensing bore being in communication with a processing agent source and the vacuum bore being in communication with a vacuum source, the nozzle including a portion for sealably engaging a selected area of the work object so that when a predetermined vacuum is applied through the vacuum bore, a processing agent is drawn from the processing agent source through the dispensing bore into contact with the selected area of the work object; and a processing agent source comprising a vessel for holding the processing agent, the vessel being adapted so that upon activation of the vacuum source, a gas external to the vessel will be drawn into a port of the vessel to vaporize the liquid processing agent, the vacuum pulling the vapors from the vessel through the dispensing bore into contact with the work object.

62. The system of claim 61 wherein the selected area comprises an alignment marker on a wafer and the nozzle is adapted to cover the alignment marker so that processing agent dispensed by the nozzle is confined substantially to the alignment marker area.

63. A nozzle for dispensing a processing agent onto a selected area of a wafer, the nozzle including a vacuum bore and a dispensing bore, the nozzle being adapted to cover the selected are so that processing agent dispensed by the nozzle is confined substantially to the selected area.

64. The method of claim 63 wherein the nozzle is adapted to cover an alignment marker on a wafer.

65. The method of claim 63 wherein the dispensing bore and the vacuum bore are disposed substantially parallel to each other in the nozzle, and the bores are disposed at about opposing sides of the nozzle.

66. A method for processing a selected area of a work object comprising:

sealably engaging a nozzle for dispensing a processing agent over a selected area of the work object, the nozzle having a vacuum bore and a dispensing bore, the dispensing bore being in communication with a source for the processing agent and the vacuum bore being in communication with a vacuum source, the vacuum bore and dispensing bore being in communication with each other when the nozzle is sealably engaged over the selected area of the work object; and applying a predetermined vacuum through the vacuum bore so that there is a flow of processing agent from the processing agent source, through the dispensing bore, into contact with the selected area of the work object, and through the vacuum bore;

continuing the flow of processing agent until the selected area of the work object has been processed to a predetermined degree by the processing agent; and wherein the flow of processing agent across the selected surface moves substantially unidirectionally from about one side of the selected area to about another side.

67. The method of claim 66 wherein the dispensing bore and vacuum bore are disposed in the nozzle so that there is a substantially unidirectional cross flow of processing agent across the selected area of the work object.

68. The method of claim 66 wherein the dispensing bore and the vacuum bore are disposed substantially parallel to each other and at opposing sides of the nozzle.

69. The method of claim 66 wherein the selected area comprises an alignment marker on a wafer.

70. The method of claim 69 wherein the alignment marker is covered by a layer comprising silicon oxide and the processing agent is an etchant.

\* \* \* \* \*